US006646247B2

(12) United States Patent
Hosier et al.

(10) Patent No.: US 6,646,247 B2
(45) Date of Patent: Nov. 11, 2003

(54) PHOTOSENSITIVE APPARATUS IN WHICH AN INITIAL CHARGE ON A PHOTODIODE IS SAMPLED AND THE RETRANSFERRED TO THE PHOTODIODE

(75) Inventors: Paul A. Hosier, Rochester, NY (US); Jagdish C. Tandon, Fairport, NY (US)

(73) Assignee: Xerox Corporation, Stamford, CT (US)

( * ) Notice: Subject to any disclaimer, the term of this patent is extended or adjusted under 35 U.S.C. 154(b) by 331 days.

(21) Appl. No.: 09/815,407

(22) Filed: Mar. 22, 2001

(65) Prior Publication Data

US 2002/0134913 A1 Sep. 26, 2002

(51) Int. Cl.[7] ............................. H01N 1/38; H01L 27/00
(52) U.S. Cl. ..................................... 250/208.1; 358/463
(58) Field of Search .................... 358/445, 446, 358/447, 463, 465, 466; 348/222.1, 223.1, 241, 243, 294, 313; 250/208.1

(56) References Cited

U.S. PATENT DOCUMENTS

| 5,081,536 | A | | 1/1992 | Tandon et al. | 358/213.31 |
|---|---|---|---|---|---|
| 5,105,277 | A | | 4/1992 | Hayes et al. | 358/213.31 |
| 5,148,268 | A | | 9/1992 | Tandon et al. | 358/41 |
| 6,031,217 | A | * | 2/2000 | Aswell et al. | 250/208.1 |

* cited by examiner

Primary Examiner—Walter E. Snow
(74) Attorney, Agent, or Firm—R. Hutter

(57) ABSTRACT

In a photosensitive device wherein a photodiode is operated by placing an initial fat zero charge thereon before the integration of a light-induced signal, the actual dark level signal created by the fat zero charge is sampled with each readout from the photodiode, and then retransferred to the photodiode. After integration, the sampled dark level is subtracted from the total signal level on the photodiode. In this way both fixed-pattern and thermally-induced noise is obviated.

7 Claims, 3 Drawing Sheets

PHOTOSENSITIVE APPARATUS IN WHICH AN INITIAL CHARGE ON A PHOTODIODE IS SAMPLED AND THE RETRANSFERRED TO THE PHOTODIODE

CROSS-REFERENCE TO RELATED APPLICATION

Cross-reference is hereby made to the following patent application, assigned to the assignee hereof and being filed simultaneously herewith: "Photosensitive Apparatus wherein an Initial Charge on a Photodiode is Sampled and Subtracted During Readout," U.S. Ser. No. 09/815,409.

INCORPORATION BY REFERENCE

The following U.S. patent applications, all assigned to the assignee hereof, are hereby incorporated by reference: 5,081,536; 5,105,277; and 5,148,268.

FIELD OF THE INVENTION

The present invention relates to image sensor devices, such as used in, for example, digital cameras or document scanning devices, and in particular to apparatus having an array of photodiodes outputting to an output line through CMOS circuitry.

BACKGROUND OF THE INVENTION

Image sensor arrays, such as found in digital document scanners and digital cameras, typically comprise a linear array of photosites which raster scan a focused image, or an image bearing document, and convert the set of microscopic image areas viewed by each photosite to image signal charges. Following an integration period the image signal charges are amplified and transferred to a common output line or bus through successively actuated multiplexing transistors.

Currently there are two generally accepted basic technologies for creating such linear arrays of photosites: Charge-coupled devices, or CCD's, and CMOS. In CMOS, the photosensors are in the form of photodiodes, which output a charge in response to light impinging thereon. In the scanning process, bias and reset charges are applied in a predetermined time sequence during each scan cycle. Certain prior art patents, such as U.S. Pat. No. 5,081,536 assigned to the assignee hereof, disclose two-stage transfer circuits for transferring image signal charges from the photosites in CMOS image sensors.

In designing photosensitive devices using photodiodes, it is desirable to use signals from the photodiodes which are created toward the middle portion of the photodiodes' response, where the response function is highly linear. In other words, light-responsive signals from the lower portion of a photodiode's response tend not to be linear, and thus unreliable as a reflection of the amount of light integrated by the photodiode at a particular time. In order to exploit the more linear middle portion of a photodiode's response, one technique, which is used in the patents incorporated by reference above, is to inject a predetermined bias charge, or "fat zero," onto the photodiode with each cycle of operation wherein light energy is integrated as a charge on the photodiode and then transferred through a transfer circuit. The fat zero bias in effect "primes the pump" of charge within the photodiode so that the nonlinear portions of the photodiode response are not used.

In practical applications of photosensitive devices using fat zero bias, two key sources of noise, which can affect the integrity of the output image signals, are "fixed pattern noise" and "thermal noise." The first of these types of noise relates to the fact that, within any device, individual photodiodes and sets of circuitry associated with the various photodiodes will have some variation in performance, and the variation in performance among the different sets of circuitry will result in a fixed pattern of noise effecting the signals, resulting in a consistent pattern of distortions in the output signals, depending on which specific set of circuitry a particular subset of the video signals passes through. Thermal noise is created by the fact that the output of a particular set of circuitry is likely to change over time, due to the random thermal movement of electrons in conductors.

It is an object of the present invention to overcome these customary sources of noise by sampling actual values of charge placed on photodiodes during the course of operation of an apparatus, and then using these actual sampled values to correct subsequent video signals.

DESCRIPTION OF THE PRIOR ART

U.S. Pat. No. 5,081,536 discloses the basic architecture of a transfer circuit which injects a bias charge onto a photodiode in a CMOS-based image sensor array. U.S. Pat. No. 5,105,277 represents an improvement to the '536 patent, in which split clock transistor actuating pulses are applied to the transfer circuit, to cancel variations among a large number of photodiodes.

U.S. Pat. 5,812,703 discloses an imaging apparatus, such as a digital camera, in which the fixed-pattern noise inherent to a particular apparatus in taken into account by storing in a non-volatile memory noise data for every photosensor of the apparatus.

SUMMARY OF THE INVENTION

According to one aspect of the present invention, there is provided a method of operating a photosensitive apparatus having at least one photodiode and storage means associated with the photodiode. A charge is injected on the photodiode. The charge is transferred from the photodiode to the storage means, and then retransferred from the storage means to the photodiode. A light signal is then integrated on the photodiode, and the charge and the light signal are read from the photodiode through the storage means.

Figure 1:
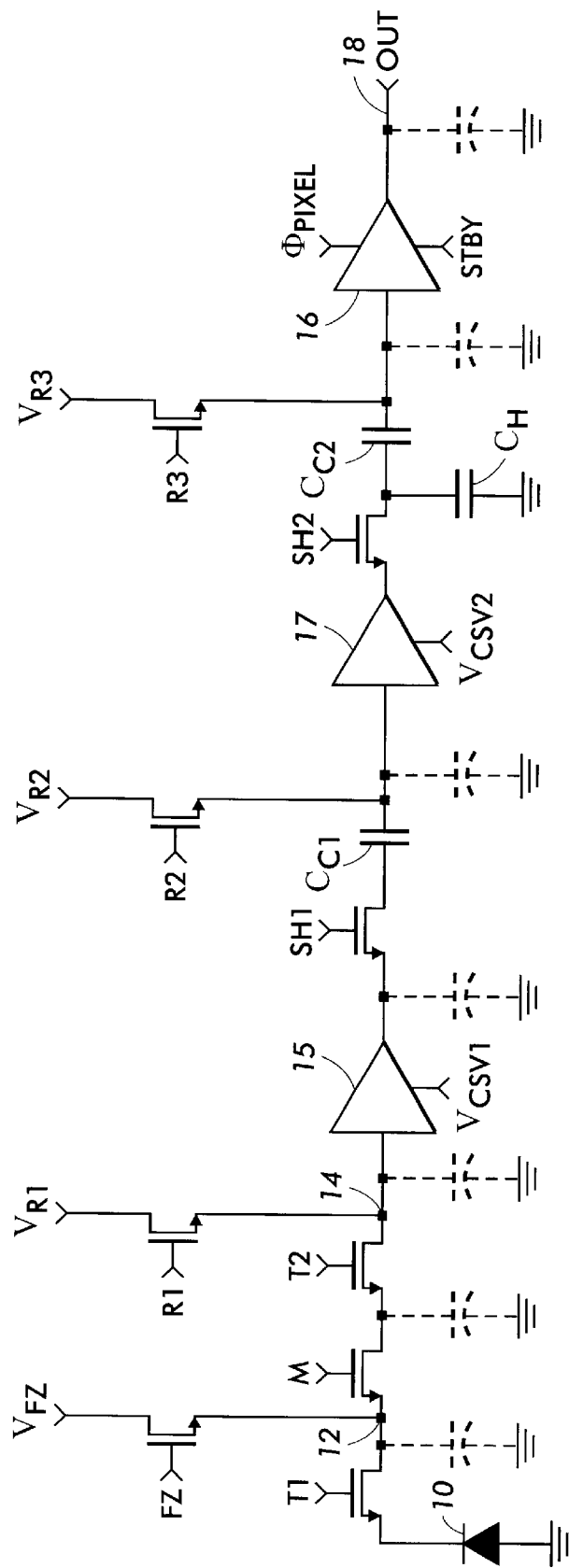
FIG. 1 is a schematic diagram of a single photosensor "cell" according to one aspect of the present invention.
Figure 2:
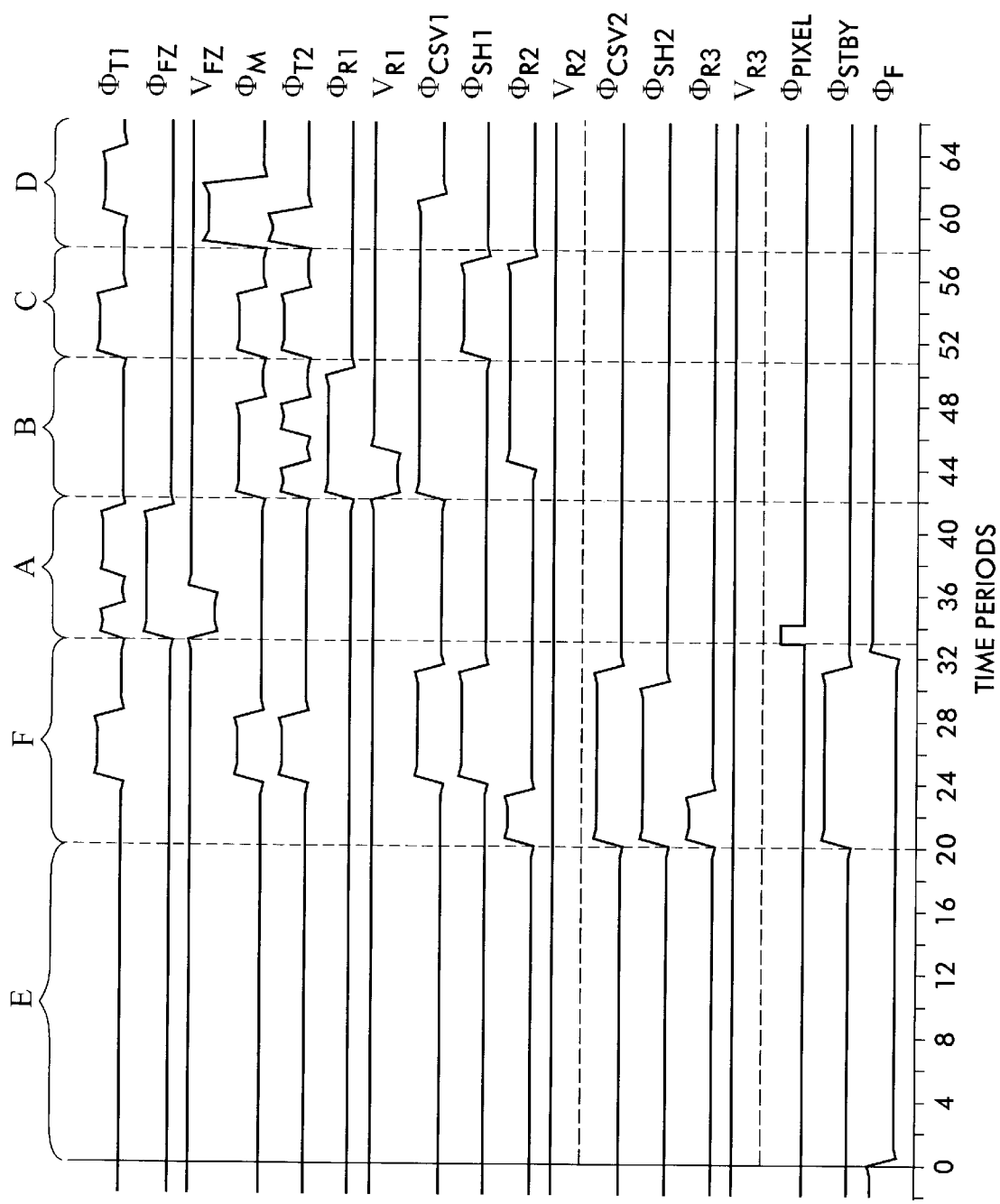
FIG. 2 is a set of comparative timing diagrams showing the overall operation of the circuit of FIG. 1 according to one embodiment of the present invention.

In the convention of this specification, an element shown in FIG. 1 will be referred to by a set of letters, while the signal which operates the element will be referred to in FIG. 2 as $\phi$ with the letters as a subscript, so that, for example, a transistor called SH1 will be operated by signals called $\phi_{SH1}$.

DETAILED DESCRIPTION OF THE INVENTION

In the following description, certain conventions will be used. In the following schematic diagrams and timing diagrams, the same index will apply both to an indicated circuit element in the schematic and to the potential or other signal in the timing diagram associated with the indicated circuit element.

FIG. 1 is a schematic diagram of a single photosensor "cell" according to one aspect of the present invention. A large number of cells (such as several hundred) are typically used in a full-color document scanner. The cell includes at least one photodiode, indicated as 10, and an associated transfer circuit. This transfer circuit includes all of the various gates shown in the Figure, and in particular, a middle node 12, reset node 14, low-power unity-gain amplifier 15, output amplifier 16, and an output line 18, which will ultimately connect to image-processing circuitry, during a read out by a shift register (not shown). There may further be provided a sample-and-hold amplifier 17. The node capacitances variously shown as phantom capacitors in the Figure can be purely parasitic, or can be designed to have certain values. The overall function of the transfer circuit within a photosensor chip is described in detail in, for example, U.S. Pat. No. 5,105,277, incorporated by reference above.

Although the basic operation of the transfer circuit is given in detail in the patent incorporated by reference, in brief, the middle node 12 serves as a location in which a "fat zero" bias charge injection, such as indicated as $V_{FZ}$ in the Figure, can be injected onto a photodiode 10. As described in the patents incorporated by reference, the purpose of this bias charge injection is to cause the photodiode to output a signal in a linear range. Downstream of the middle node 12, the reset node 14 and its associated circuitry allows a reset voltage $V_{R1}$ to be placed on the transfer circuit, $V_{R1}$ being of such a magnitude as to draw a signal from the photodiode 10 through the transfer circuit, ultimately through amplifier 16 and onto output line 18.

With particular reference to the Figure, there are further provided circuit elements which facilitate the present invention in this embodiment. These circuit elements are indicated by the signals which operate them, as will be described below. The basic fat-zero transfer circuit is characterized by transistors T1 and T2, while the fat zero voltage $V_{FZ}$ is injected onto the photodiode by activation of the transistor FZ. The basic transfer circuit is reset, as described in the above-referenced patents, by voltage $V_{R1}$ when the transistor R1 is activated.

The circuit elements for sampling and temporarily storing fat-zero bias charge injections are capacitor $C_{C1}$, which is attached at a first side thereof by a sample and hold transistor SH1, and on the second side thereof by a second reset voltage $V_{R2}$, activated by transistor R2. (In the language of some of the claims, the capacitor forms a storage node for temporarily retaining a charge.) There are also parasitic capacitances on either side of capacitor $C_{C1}$, which have to be taken into account to obtain desirable performance.

Further downstream of the circuitry for sampling the fat-zero bias is circuitry forming a sample and hold stage, characterized by capacitor $C_{C2}$, bounded by sample and hold transistor SH2 and reset voltage VR3, activated via transistor R3. Finally, there is provided a pixel amplifier 16 which aids in reading out an individual image signal onto a common video line along with the outputs of other photodiodes (not shown).

The operation of the various circuit elements at predetermined times is carried out by a clocking means (not shown) ultimately connected to each contact in FIG. 1, the essential nature of which is known in the art. Such clocking means could comprise, for example, a suitably programmed general-purpose microprocessor.

The overall operation of the circuit of FIG. 1 with regard to the present invention can be summarized as follows. With each cycle of operation in which a charge on the photodiode is intended to be transferred to an output line, initially a fat zero bias charge is placed on the photodiode 10, while the various nodes in the transfer circuit are reset to known levels. Then, the fat zero charge on the photodiode is sampled by the capacitor $C_{C1}$: this is a reading of the actual "dark level" charge on the photodiode at that time, the amount of charge on the photodiode 10 if no image-related light were to create charge on the photodiode. After this dark level is sampled, the fat zero is transferred back to the photodiode 10 in a charge conserving fashion. Then, a light signal relating to an image is integrated on the photodiode 10, resulting in a total signal which is the sum of the sampled dark level (which equals the sampled fat zero) and the light signal. This total signal is then transferred through the charged capacitor $C_{C1}$ while all amplifiers and sampled gates are open, resulting in the signal level (the total signal minus the sampled dark level on $C_{C1}$) being sampled by the $C_{C2}$ storage capacitor, where it is held until read out by a video-out process. In effect, the actual dark level for the particular cell at that particular time is sampled so that the "pure" image-induced light signal can be isolated, obviating both fixed-pattern and most thermal noise. The fat zero photodiode kT/C noise is totally cancelled.

To clarify the structure and function of the illustrated embodiment with regard to the claims below, the "storage means" in the embodiment includes the capacitor $C_{C1}$, as well as amplifier 15. When a charge is read through amplifier 15 and stored on the capacitor $C_{C1}$, in this embodiment, strictly speaking the output of amplifier 15 is not the charge directly from the photodiode 10 but rather an output related to, or representative of, the charge from the photodiode which is retained on reset node 14 and input to amplifier 15. In a practical sense, amplifier 15 is useful for accurate retransferring of the charge on the reset node 14 back to photodiode 10, pursuant to the claimed invention. Nonetheless, the effect of reading charge through amplifier 15 and storing it on $C_{C1}$ is that the charge on photodiode 10 is measured and stored, such as for future use when subtracting the stored charge value in a later readout process.

FIG. 2 is a set of comparative timing diagrams showing the overall operation of the circuit of FIG. 1 in detail, according to one embodiment of the present invention. With reference to the Figure, the sequence of operations indicated as time intervals A–F occurs on a repetitive basis, so that, for each photodiode, a series of signal outputs are created over time: in the case of an input scanner, as is well known, this repeated outputting of signals over time is coordinated with relative movement of an original image (such as on a sheet of paper to be copied) so that the apparatus successively records from a series of small areas of the original image.

With each cycle of operation for a single photodiode the apparatus operates as follows. At time A, the fat zero charge is injected (by fill and spill) on the photodiode 10 by pulsing the $V_{FZ}$, $\phi_{FZ}$, and $\phi_{T1}$ signals. At the same time, the readout of the previous signal (from a previous cycle of operation, such when another small area on an image to be scanned was recorded) is also taking place. After the fat zero injection at time B, a fill and spill transfer is done on the middle nodes to reset them to known levels, which are independent of previous signals, so that lag is avoided. This is followed, at time C, by the first forward transfer of charge to bring the fat zero charge forward to be stored, or sampled, on the $C_{C1}$, storage capacitor.

After this dark level is sampled, at time D, the fat zero is transferred back to the photodiode in a charge conserving, or CCD, fashion. Time E represents the integration period of the photodiode, wherein light energy accumulated on the photodiode is integrated to form a usable image signal. The fat zero and signal charge is then transferred forward once again, as shown at time F. This time all amplifiers and sampled gates are open and the difference of the stored fat zero dark level and the fat zero plus signal level is flushed through and then sampled on the $C_{C2}$ storage capacitor. This correlated double sampled signal is held on this capacitor until each of the pixel amplifiers is sequentially read out.

In order to design and operate the illustrated apparatus in an effective manner, certain practical aspects of the transfer circuit must be taken into account. One must design appropriate analog levels on the various transfer gates so that there is adequate signal range provided in the circuit. The back transfer shown in period D in FIG. 2 is, in this embodiment, a CCD type of transfer without perfect transfer efficiency. Instead of the charge moving from source to drain as during bucket brigade transfer, the charge moves from gate to gate. The transfer is not perfectly efficient because the gates do not overlap, and because there is a finite gate voltage difference and also small storage nodes between the gates. However, as long as some or most of the fat zero signal makes it back to the photodiode 10, the later signal charge transfer will be linear and all charge will be conserved and make it back to the reset node 14 to be used in a second sample. Therefore, the first and second sample will be correlated by the same fat zero.

In alternate possible embodiments of the invention, the low power unity gain amplifiers shown in FIG. 1 could be replaced by selectable source followers or any other type of voltage buffer circuit. If one is not concerned with the random process induced offset variation of the second amplifier along the circuit, the R3 transistor and $C_{C2}$ capacitor could be removed. When $C_{C2}$ is used to remove this offset, $C_H$ is used to reduce the sample-and-hold charge injection effect that would be seen when the SH2 gate closes to sample the signal.

In the described embodiment, the various enable signals on all amplifiers are clocked to save power when the amplifiers are not used. If one were willing to have an integration time that is non-overlapping with readout time, the intermediate fat zero storage node (on capacitor $C_{C1}$) and the associated transistors, amplifier and storage capacitor would not be needed. The sampling could be done on capacitor $C_{C2}$ and then read out after the end of the integration of a first signal and before the start of integration of a subsequent signal. This would result in a lower responsivity for a given scan rate or data rate.

Figure 3:
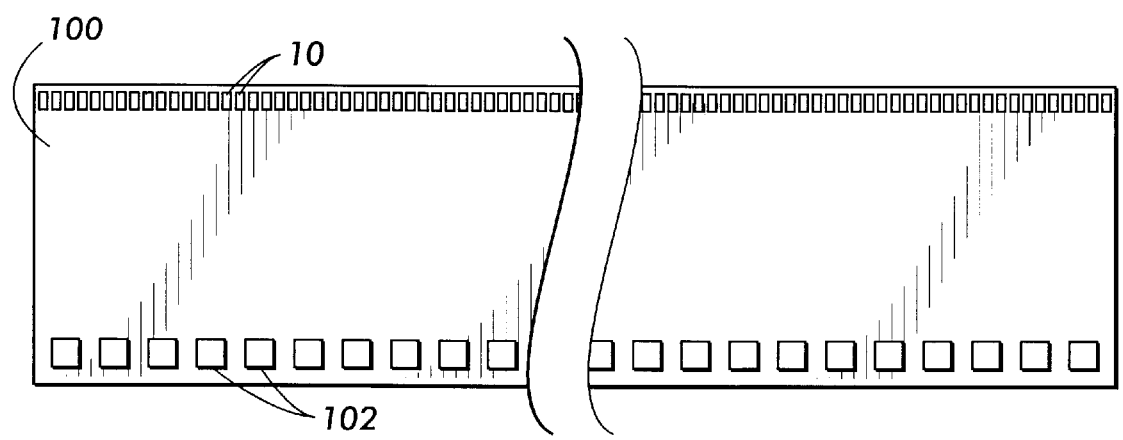
FIG. 3 is a plan view showing the externally-visible portions of a photosensitive apparatus incorporating the present invention.

FIG. 3 is a plan view showing the externally-visible portions of a photosensitive apparatus incorporating the present invention, in this case a chip 100 which could be butted, in a known manner, with other chips of a similar design in, for example, a full-page-width image scanner as used in digital copier or facsimile. As shown, there is provided a linear array of photodiodes 10: each photodiode 10 corresponds to small area of an image to be recorded. In an input scanner, an image on an original sheet to be recorded moves or is moved relative to the array, so that successive small areas of the image are recorded over time. The present invention can apply as well to a color apparatus having three linear arrays of photodiodes 10, each row having a filter associated therewith to pass light of one primary color; in such a case, three photodiodes 10, each filtered for a different color, can share a single middle node 12 and other circuitry to form a single cell. The present invention can also be applied to an apparatus wherein photodiodes are arranged in a two-dimensional array, such as in a digital camera, with rows or columns (or portions thereof) in the array being connected to form cells. Also shown in the Figure are a number of contact pads 102: depending on the particular design of a chip 100 and a larger apparatus in which it is installed, the various voltage inputs such as shown in FIG. 1 can originate off the chip or within the chip, and thus the inputs into pads 102 could be to one or another extent the direct voltage inputs to the cells (with the clocking of individual signals, such as shown in FIG. 2, being done by an external device such as microprocessor), or could simply be controls to an on-chip timing or clocking system which carries out the switching such as shown in FIG. 2.

What is claimed is:

1. A method of operating a photosensitive apparatus having at least one photodiode and a storage means associated with the photodiode, comprising the steps of injecting a charge on the photodiode;

transferring the charge from the photodiode to the storage means;

retransferring the charge from the storage means to the photodiode;

integrating a light signal on the photodiode; and reading the charge and the light signal from the photodiode through the storage means.

2. The method of claim 1, the retransferring step occurring in a charge-conserving fashion.

3. The method of claim 1, the storage means being associated with a first capacitor.

4. The method of claim 1, the first capacitor being disposed in series relative to the photodiode.

5. The method of claim 1, wherein the storage means includes a first amplifier disposed between the photodiode and the first capacitor.

6. The method of claim 1, further comprising the step of storing the charge related to the fat zero charge and the light signal read through the first capacitor on a second capacitor.

7. The method of claim 6, wherein the apparatus includes a second amplifier disposed between the photodiode and the second capacitor.

* * * * *